United States Patent [19]
Suzuki et al.

[11] Patent Number: 5,293,339
[45] Date of Patent: Mar. 8, 1994

[54] SEMICONDUCTOR INTEGRATED CIRCUIT CONTAINING REDUNDANT MEMORY ELEMENT

[75] Inventors: Toshikazu Suzuki, Nishinomiya; Hisakazu Kotani, Takarazuka; Hironori Akamatsu, Osaka, all of Japan

[73] Assignee: Matsushita Electric Industrial Co., Ltd., Osaka, Japan

[21] Appl. No.: 863,268

[22] Filed: Apr. 3, 1992

[30] Foreign Application Priority Data

Apr. 4, 1991 [JP] Japan .................. 3-71581

[51] Int. Cl.⁵ .................. G11C 8/00; H03K 19/003
[52] U.S. Cl. .................. 365/200; 365/203; 365/225.7; 307/202.1; 307/441
[58] Field of Search .................. 365/200, 201, 225.7; 371/10; 307/202.1, 441, 449

[56] References Cited
U.S. PATENT DOCUMENTS

| | | | |
|---|---|---|---|
| 4,573,146 | 2/1986 | Graham et al. | 365/200 |
| 4,689,494 | 8/1987 | Chen et al. | 365/200 |
| 4,714,839 | 12/1987 | Chung | 365/200 |
| 5,058,059 | 10/1991 | Matsuo et al. | 365/200 |

Primary Examiner—Eugene R. LaRoche
Assistant Examiner—Son Dinh
Attorney, Agent, or Firm—Lowe, Price, LeBlanc & Becker

[57] ABSTRACT

A semiconductor integrated circuit contains a plurality of programmable circuits each including a plurality of fuses and a first transistor which has a gate subjected to an address decoded signal, a drain connected to first ends of the fuses, and a source connected to a common precharge node. The address decoded signal results from decoding a first portion of an address signal for access to memory cells. The sources of the first transistors in the respective programmable circuits are connected to the common precharge node. A plurality of second transistors have gates subjected to a second portion of the address signal, sources connected to a first power supply line, and drains connected to second ends of the fuses in each of the programmable circuits respectively. The second portion of the address signal differs from the first portion of the address signal. A third transistor has a gate subjected to a precharge control signal, a source connected to a second power supply line, and a drain connected to the common precharge node.

4 Claims, 6 Drawing Sheets

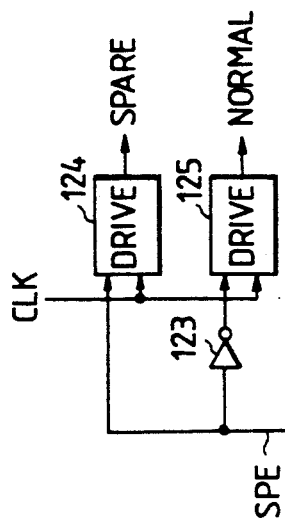
FIG. 4
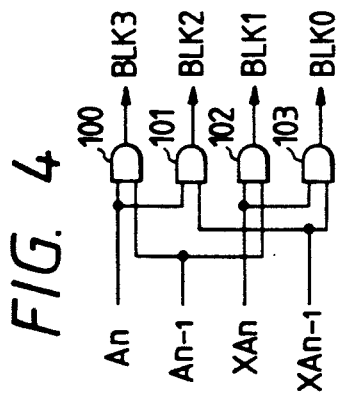
FIG. 3
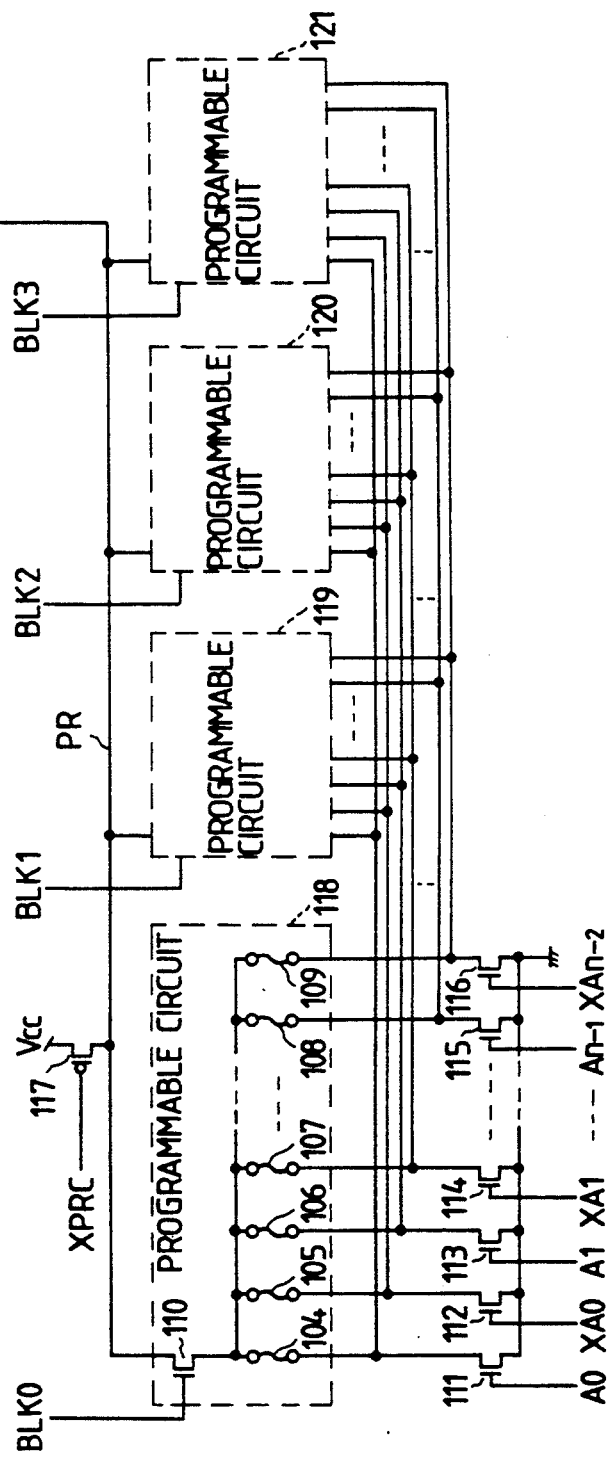

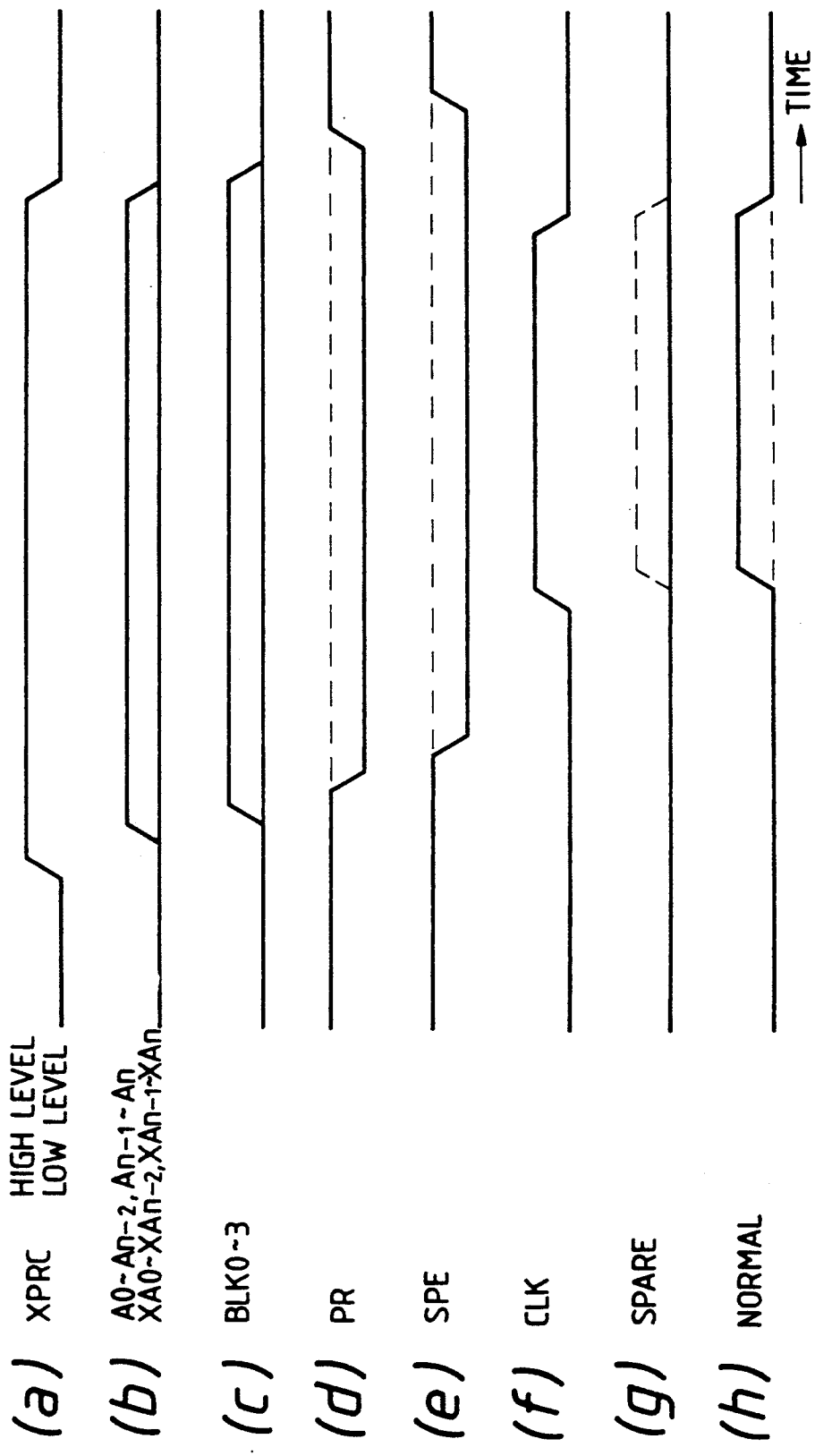

SEMICONDUCTOR INTEGRATED CIRCUIT CONTAINING REDUNDANT MEMORY ELEMENT

BACKGROUND OF THE INVENTION

This invention relates to a semiconductor integrated circuit including a redundancy circuit.

During the fabrication of semiconductor memories, there is a chance that one or more memory cells go defective. Some semiconductor memories feature a redundancy, including ordinary memory cells and redundant or spare memory cells. When an ordinary memory cell goes defective, the defective memory cell is replaced by a redundant (spare) memory cell. This replacement is executed by a redundancy circuit.

As will be explained later, a prior art semiconductor integrated circuit including a redundancy circuit has some problems.

SUMMARY OF THE INVENTION

It is an object of this invention to provide an improved semiconductor integrated circuit.

A first aspect of this invention provides a semiconductor integrated circuit comprising a plurality of programmable circuits each including a plurality of fuses and a first transistor which has a gate subjected to an address decoded signal, a drain connected to first ends of the fuses, and a source connected to a common precharge node, wherein the address decoded signal results from decoding a first portion of an address signal for access to memory cells, and wherein the sources of the first transistors in the respective programmable circuits are connected to the common precharge node; a plurality of second transistors having gates subjected to a second portion of the address signal, sources connected to a first power supply line, and drains connected to second ends of the fuses in each of the programmable circuits respectively, wherein the second portion of the address signal differs from the first portion of the address signal; and a third transistor having a gate subjected to a precharge control signal, a source connected to a second power supply line, and a drain connected to the common precharge node.

A second aspect of this invention provides a semiconductor integrated circuit comprising first means for memorizing a state of a first bit of an address of a first defective memory cell; second means for memorizing a state of a first bit of an address of a second defective memory cell; third means for selecting one of the first means and the second means in response to a state of a second bit of an input address signal; fourth means for detecting whether or not a state of a first bit of the input address signal is equal to the state memorized by the first means, and for detecting whether or not the state of the first bit of the input address signal is equal to the state memorized by the second means; a common node; fifth means for outputting a spare memory cell selecting signal to the common node when the first means is selected by the third means and the fourth means detects that the state of the first bit of the input address signal is equal to the state memorized by the first means, and for outputting the spare memory cell selecting signal when the second means is selected by the third means and the fourth means detects that the state of the first bit of the input address signal is equal to the state memorized by the second means.

A third aspect of this invention provides a semiconductor integrated circuit comprising a common precharge node; first means for precharging the common precharge node to a charged state; second means for memorizing a state of a first bit of an address of a first defective memory cell; third means for memorizing a state of a first bit of an address of a second defective memory cell; fourth means for selecting one of the second means and the third means in response to a state of a second bit of an input address signal; fifth means for detecting whether or not a state of a first bit of the input address signal is equal to the state memorized by the second means, and for detecting whether or not the state of the first bit of the input address signal is equal to the state memorized by the third means; sixth means for holding the common precharge node in the charged state when the second means is selected by the fourth means and the fifth means detects that the state of the first bit of the input address signal is equal to the state memorized by the second means, and for holding the common precharge node in the charged state when the third means is selected by the fourth means and the fifth means detects that the state of the first bit of the input address signal is equal to the state memorized by the third means; and seventh means for discharging the common precharge node from the charged state when the fifth means detects that the state of the first bit of the input address signal is not equal to any of the states memorized by the second and third means.

BRIEF DESCRIPTION OF THE DRAWINGS

FIG. 3 is a diagram of a semiconductor integrated circuit according to a first embodiment of this invention.

FIG. 4 is a diagram of an address decoder in the first embodiment of this invention.

FIGS. 5(a)–(h) are a time domain diagram showing the waveforms of various signals in the semiconductor integrated circuit of FIG. 3.

DESCRIPTION OF THE PRIOR ART

Figure 1:
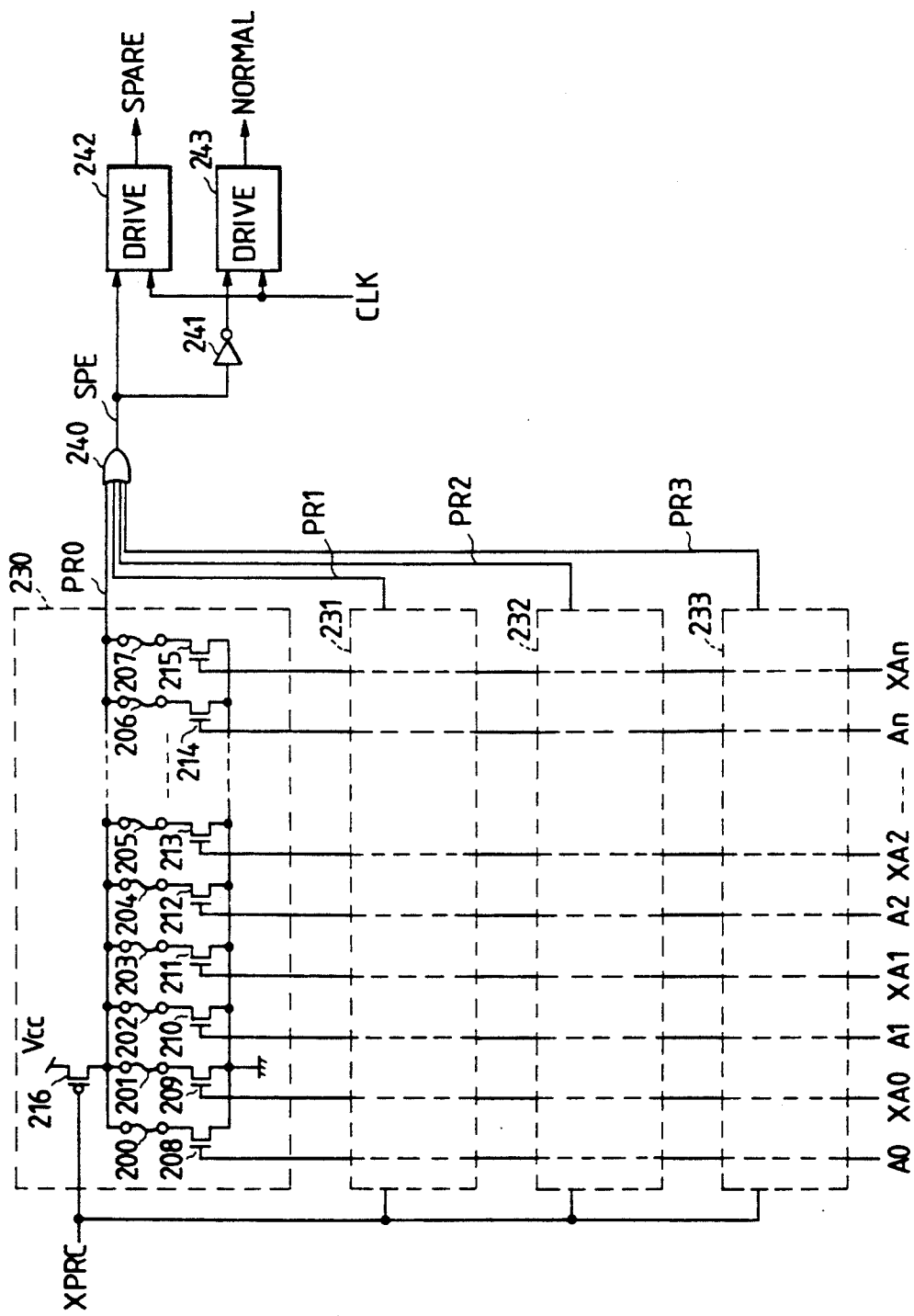
FIG. 1 is a diagram of a prior art semiconductor integrated circuit.

FIG. 1 shows a prior art semiconductor integrated circuit in which a first address signal having bits A0, A1, ..., An is designed for access to memory cells (not shown). A second address signal has bits XA0, XA1, ..., XAn which are logically complementary with the bits A0, A1, ..., An of the first address signal respectively.

Fuses 200–207 in a linear array are physically blown or unblown by a laser light beam when a redundancy circuit is required to be used. First ends of the fuses 200–207 are connected in common to a precharge node PR0. Second ends of the fuses 200–207 are connected to the drains of n-channel transistors 208–215 respectively. The gates of the transistors 208–215 are subjected to the bits A0, XA0, A1, XA1, ..., An, XAn of the address signals respectively. The sources of the transistors 208-215 are grounded, being subjected to a power supply ground potential.

A p-channel transistor 216 has a gate subjected to a precharge control signal XPRC. The source of the transistor 216 is subjected to a positive power supply voltage Vcc. The drain of the transistor 216 is connected to the precharge node PR0.

A programmable circuit 230 serves to program an address of a defective memory cell. The programmable circuit 230 includes the fuses 200-207, the n-channel transistors 208-215, and the p-channel transistor 216. The programmable circuits 230 receives the precharge control signal XPRC and the address signal bits A0-An and XA0-XAn, and outputs a signal to the precharge node PR0.

Programmable circuits 231-233 are similar in structure to the programmable circuit 230. Each of the programmable circuits 231-233 receives the precharge control signal XPRC and the address signal bits A0-An and XA0-XAn, and outputs a signal to a precharge node PR1, PR2, or PR3.

An OR gate 240 receives the signals on the precharge nodes PR0-PR3, and outputs a redundancy circuit activating signal SPE. An inverter 241 receives the redundancy circuit activating signal SPE, and outputs the inversion of the redundancy circuit activating signal SPE. A driver 242 receives the redundancy circuit activating signal SPE and a clock signal CLK, and outputs a redundancy circuit drive signal SPARE. A driver 243 receives the inversion of the redundancy circuit activating signal SPE and the clock signal CLK, and outputs an ordinary circuit drive signal NORMAL.

It is now assumed that a defective ordinary memory cell is detected during the check of a semiconductor memory which is performed after the fabrication of the semiconductor memory. Half members of the fuses 200-207 which correspond to the address of the defective memory cell are physically blown before the shipment of the semiconductor memory. The blown fuses enable the redundancy circuit, allowing the selection of a redundant (spare) memory cell in place of the defective memory cell.

In the case where the lowest bit of an address of the defective memory cell is "0" and the redundancy circuit is required to be used, the fuse 200 is unblown but the fuse 201 is blown by a laser light beam in view of the following fact. When an address signal corresponding to the defective memory cell is generated, the address signal bit A0 is in a low level state but the address signal bit XA0 is in a high level state so that the transistor 208 becomes non-conductive but the transistor 209 becomes conductive. In the case where the lowest bit of the address of the defective memory cell is "1" and the redundancy circuit is required to be used, the fuse 201 is unblown but the fuse 200 is blown by the laser light beam in view of the following fact. When an address signal corresponding to the defective memory cell is generated, the address signal bit A0 is in the high level state but the address signal bit XA0 is in the low level state so that the transistor 208 becomes conductive but the transistor 209 becomes non-conductive. Similarly, the other fuses 202-207 are blown and unblown in accordance with the states of the remaining bits of the address of the defective memory cell. Specifically, the fuses 202-207 are separated into pairs corresponding to the remaining bits of the address of the defective memory cell respectively, and one of the fuses in each pair is blown according to the state of the related bit of the address of the defective memory cell. In this way, the address of the defective memory cell is programmed or memorized in the programmable circuit 230. Similarly, addresses of other defective memory cells can be programmed in the other programmable circuits 231-233. In the prior art semiconductor integrated circuit of FIG. 1, since there are the four programmable circuits 230-233, four defective memory cells can be replaced by redundant (spare) memory cells.

The operation of the prior art semiconductor integrated circuit of FIG. 1 will be explained hereinafter. As shown in the portions (a) and (c) of FIG. 2, during a first period for which the precharge control signal XPRC remains at a low level, the transistor 216 of each of the programmable circuits 230-233 continues to be conductive so that the signals at the precharge nodes PR0-PR3 are held at a high level. Then, the precharge control signal XPRC changes to a high level. As shown in the portions (a) and (b) of FIG. 2, after the change of the precharge control signal XPRC to the high level, the address signal bits A0-An and XA0-XAn are each settled in a high level state or a low level state.

For example, when an address signal corresponding to an address programmed in the programmable circuit 230 is generated, half members of the transistors 208-215 are made conductive by high-level members of the address signal bits A0-An and XA0-An and all of these conductive transistors are connected to previously-blown members of the fuses 200-207 respectively. Thus, as shown by the broken line in the portion (c) of FIG. 2, the signal at the precharge node PR0 continues to be in the high level state.

When an address signal unrelated to an address programmed in the programmable circuit 230 is generated, half members of the transistors 208-215 are made conductive by high-level members of the address signal bits A0-An and XA0-XAn and at least one of these conductive transistors is connected to an unblown member of the fuses 200-207. Thus, as shown by the solid line in the portion (c) of FIG. 2, the signal at the precharge node PR0 changes to the low level state.

Figure 2:
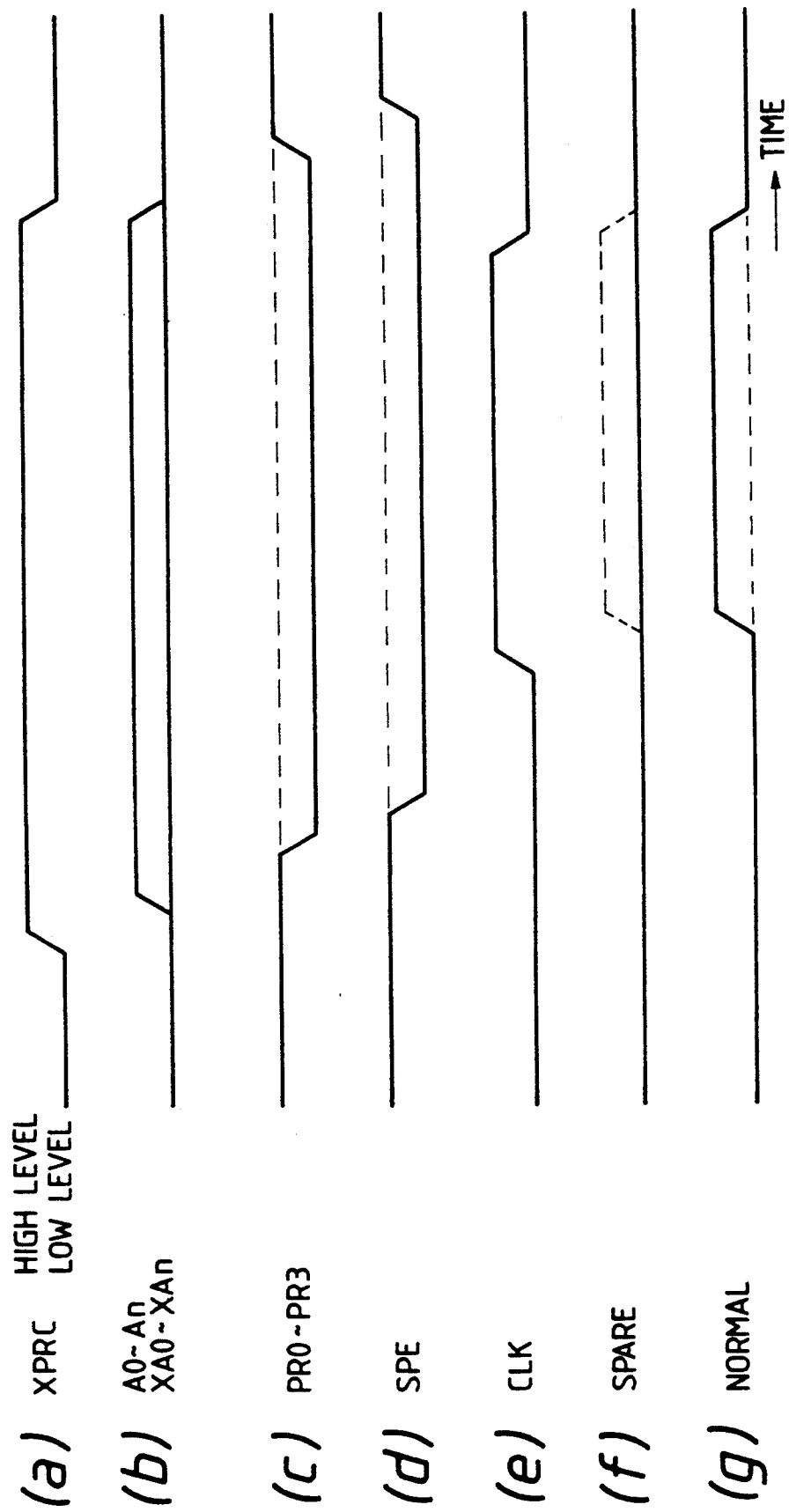
FIGS. 2(a)–(g) are a time domain diagram showing the waveforms of various signals in the prior art semiconductor integrated circuit of FIG. 1.

When address signals corresponding to addresses programmed in the other programmable circuits 231-233 are generated, the signals at the precharge nodes PR1-PR3 similarly continue to be in the high level states as shown by the broken line in the portion (c) of FIG. 2. When address signals unrelated to addresses programmed in the other programmable circuits 231-233 are generated, the signals at the precharge nodes PR1-PR3 similarly change to the low level states as shown by the solid line in the portion (c) of FIG. 2.

In the case where an address signal corresponding to one of the addresses programmed in the programmable circuits 230-233 is generated, one of the signals at the precharge nodes PR0-PR3 continues to be in the high level state so that the redundancy circuit activating signal SPE also continues to be in the high level state as shown by the broken line in the portion (d) of FIG. 2. Then, as shown in the portion (e) of FIG. 2, the clock signal CLK changes to the high level, and thus the redundancy circuit drive signal SPARE also changes to the high level as shown by the broken line in the portion (f) of FIG. 2. The high-level redundancy circuit drive signal SPARE enables access to a redundant (spare) memory cell in place of the defective memory cell. During this period, the ordinary circuit drive signal NORMAL remains at the low level as shown by the broken line in the portion (g) of FIG. 2. The low-level ordinary drive signal NORMAL inhibits access to the defective ordinary memory cell.

In the case where an address signal unrelated to any of the addresses programmed in the programmable circuits 230-233 is generated, all the signals at the precharge nodes PR0-PR3 change to the low level as shown by the solid line in the portion (c) of FIG. 2 so that the redundancy circuit activating signal SPE also changes to the low level as shown by the solid line in the portion (d) of FIG. 2. Then, as shown in the portion (e) of FIG. 2, the clock signal CLK changes to the high level. The redundancy circuit drive signal SPARE continues to be in the low level state as shown by the solid line in the portion (f) of FIG. 2 independent of the change of the clock signal CLK to the high level. The low-level redundancy circuit drive signal SPARE inhibits access to a redundant (spare) memory cell. During this period, the ordinary circuit drive signal NORMAL changes to the high level as shown by the solid line in the portion (g) of FIG. 2. The high-level ordinary drive signal NORMAL enables access to an ordinary memory cell which is designated by the generated address signal.

The prior art semiconductor integrated circuit of FIG. 1 has the following problems. During access to a good ordinary memory cell, all the precharge nodes PR0-PR3 are charged via the transistor 216 and are discharged via unblown members of the fuses 200-207 and associated members of the transistors 208-215. The charging and the discharging wastefully consume electric power. Since a generated address signal is fed to all the programmable circuits 230-233, the address signal tends to be exposed to a large load. The large load on the address signal causes an obstacle to the attainment of high-speed access to memory cells. The fuses in the programmable circuits 230-233 tend to occupy a large area.

DESCRIPTION OF THE FIRST PREFERRED EMBODIMENT

FIGS. 3 and 4 show a semiconductor integrated circuit of a first embodiment of this invention in which a first address signal having bits A0, A1, . . . , An is designed for access to memory cells (not shown). A second address signal has bits XA0, XA1, . . . , XAn which logically complementary with the bits A0, A1, . . . , An of the first address signal respectively.

Fuses 104-109 in a linear array are physically blown or unblown by a laser light beam when a redundancy circuit is required to be used. First ends of the fuses 104-109 are connected in common to the drain of an n-channel transistor 110. Second ends of the fuses 104-109 are connected to the drains of n-channel transistors 111-116 respectively. The gate of the transistor 110 is subjected to a 1-bit address decoded signal BLK0. The source of the transistor 110 is connected to a precharge node PR. The gates of the transistors 111-116 are subjected to the bits A0, XA0, A1, XA1, . . . , An-2, XAn-2 of the address signals respectively. The sources of the transistors 111-116 are grounded, being subjected to a power supply ground potential.

A p-channel transistor 117 has a gate subjected to a precharge control signal XPRC. The source of the transistor 117 is subjected to a positive power supply voltage Vcc. The drain of the transistor 117 is connected to the precharge node PR.

A programmable circuit 118 serves to program an address of a defective memory cell. The programmable circuit 118 includes the fuses 104-109 and the transistor 110. The programmable circuit 118 receives the address decoded signal BLK0 and the signals at the drains of the transistors 111-116, and outputs a signal to the precharge node PR.

Programmable circuits 119-121 are similar in structure to the programmable circuit 118. Transistors in the programmable circuits 119-121 which correspond to the transistor 110 in the programmable circuit 118 are subjected to 1-bit address decoded signals BLK1-BLK3 respectively. Each of the programmable circuits 119-121 is connected to the precharge node PR and the drains of the transistors 111-116 similarly to the connection of the programmable circuit 118 thereto. Each of the programmable circuits 119-121 receives the address decoded signal BLK1, BLK2, or BLK3 and the signals at the drains of the transistors 111-116, and outputs a signal to the precharge node PR.

As shown in FIG. 4, an address decoder includes AND gates 100-103. The AND gate 100 executes logic AND operation between the highest bit An of the first address signal and the second highest bit An-1 of the first address signal, outputting the address decoded signal BLK3. The AND gate 101 executes logic AND operation between the highest bit An of the first address signal and the second highest bit XAn-1 of the second address signal, outputting the address decoded signal BLK2. The AND gate 102 executes logic AND operation between the second highest bit An-1 of the first address signal and the highest bit XAn of the second address signal, outputting the address decoded signal BLK1. The AND gate 103 executes logic AND operation between the highest bit XAn of the second address signal and the second highest bit XAn-1 of the second address signal, outputting the address decode signal BLK0.

As shown in FIG. 3, the signal at the precharge node PR is transmitted through a buffer 122 and forms a redundancy circuit activated signal SPE. An inverter 123 receives the redundancy circuit activating signal SPE, and outputs the inversion of the redundancy circuit activating signal SPE. A driver 124 receives the redundancy circuit activating signal SPE and a clock signal CLK, and outputs a redundancy circuit drive signal SPARE. A driver 125 receives the inversion of the redundancy circuit activating signal SPE and the clock signal CLK, and outputs an ordinary circuit drive signal NORMAL.

Only one of the address decoded signals BLK0-BLK3 is in the high level state in response to the highest bit An and the second highest bit An-1 of the first address signal, and the highest bit XAn and the second highest bit XAn-1 of the second address signal. The transistor 110 within the programmable circuit 118 and the corresponding transistors within the programmable circuits 119-121 serve as switches for selectively connecting and disconnecting the fuse arrays to and from the precharge node PR in response to the address decoded signals BLK0-BLK3. Since only one of the address decoded signals BLK0-BLK3 is in the high level state, only one of the switches is closed so that only one of the fuse arrays within the programmable circuits 118-121 is connected to the precharge node PR. In this way, one of the programmable circuits 118-121 is selected in response to the highest bit An and the second highest bit An-1 of the first address signal, and the highest bit XAn and the second highest bit XAn-1 of the second address signal. In other words, one of the programmable circuits 118–121 is selected in accordance with the highest and second highest bits of an address signal, and the four programmable circuits 118–121 correspond to the four different states of these two bits respectively.

During an address programming process, the highest and second highest bits of the address of a defective memory cell are examined, and one of the programmable circuits 118–121 which corresponds to the states of the highest and second highest bits of the address is decided as an object into which the address will be programmed.

It is now assumed that a defective ordinary memory cell is detected during the check of a semiconductor memory which is performed after the fabrication of the semiconductor memory. The highest and second highest bits of the address of the defective memory cell are examined, and one of the programmable circuits 118–121 which corresponds to the states of the highest and second highest bits of the address is elected. Half members of the fuses in the elected programmable circuits which correspond to the remaining bits of the address of the defective memory cell are physically blown before the shipment of the semiconductor memory. The blown fuses enable the redundancy circuit, allowing the selection of a redundant (spare) memory cell in place of the defective memory cell.

In the case where the states of the highest and second highest bits of an address of the defective memory cell correspond to the programmable circuit 118 and where the lowest bit of the address of the defective memory cell is "0" and the redundancy circuit is required to be used, the fuse 104 is unblown but the fuse 105 is blown by a laser light beam in view of the following fact. When an address signal corresponding to the defective memory cell is generated, the address signal bit A0 is in a low level state but the address signal bit XA0 is in a high level state so that the transistor 111 becomes non-conductive but the transistor 112 becomes conductive. In the case where the states of the highest and second highest bits of an address of the defective memory cell correspond to the programmable circuit 118 and where the lowest bit of an address corresponding to the defective memory cell is "1" and the redundancy circuit is required to be used, the fuse 105 is unblown but the fuse 104 is blown by the laser light beam in view of the following fact. When an address signal corresponding to the defective memory cell is generated, the address signal bit A0 is in the high level state but the address signal bit XA0 is in the low level state so that the transistor 111 becomes conductive but the transistor 112 becomes non-conductive. Similarly, the other fuses 106–109 are blown and unblown in accordance with the states of the remaining bits except the highest and second highest bits of the address of the defective memory cell. Specifically, the fuses 106–109 are separated into pairs corresponding to the remaining bits except the highest and second highest bits of the address of the defective memory cell respectively, and one of the fuses in each pair is blown according to the state of the related bit of the address of the defective memory cell. In this way, the third highest bit to the lowest bit of the address of the defective memory cell are programmed or memorized in the programmable circuit 118. Similarly, addresses of other defective memory cells can be programmed in the other programmable circuits 119–121. In the semiconductor integrated circuit of FIGS. 3 and 4, since there are the four programmable circuits 118–121, four defective memory cells can be replaced by redundant (spare) memory cells.

The operation of the semiconductor integrated circuit of FIGS. 3 and 4 will be explained hereinafter. As shown in the portions (a) and (d) of FIG. 5, during a first period for which the precharge control signal XPRC remains at a low level, the transistor 117 is made conductive so that the precharge node PR is charged and then the signal at the precharge node PR remains at a high level. Thereafter, the precharge control signal XPRC changes to a high level. As shown in the portions (a) and (b) of FIG. 5, after the charge of the precharge control signal XPRC to the high level, the address signal bits A0–An and XA0–XAn are each settled in a high level state or a low level state. Thus, as shown in the portion (c) of FIG. 5, one of the address decoded signals BLK0–BLK3 changes to a high level but the others continue to be in the low level states. The change of one of the address decoded signals BLK0–BLK3 to the high level makes conductive the related transistor (the transistor 110 in the case of the programmable circuit 118) within corresponding one of the programmable circuits 118–121.

For example, when an address signal corresponding to an address programmed in the programmable circuit 118 is generated, the address decoded signal BLK0 changes to the high level but the other address decoded signals BLK1–BLK3 remain at the low level (see the portion (c) of FIG. 5). Thus, the transistor switch 110 within the programmable circuit 118 is made conductive but the transistor switches within the other programmable circuits 119–121 remain non-conductive according to the states of the highest bit and the second highest bit of the generated address signal, so that only the programmable circuit 118 is selected and operatively connected to the precharge node PR. At the same time, half members of the transistors 111–116 are made conductive by high-level members of the address signal remaining bits A0–An-2 and XA0–XAn-2 and all of these conductive transistors are connected to previously-blown members of the fuses 104–109 respectively. Thus, as shown by the broken line in the portion (d) of FIG. 5, the signal at the precharge node PR continues to be in the high level state.

When an address signal unrelated to any of addresses programmed in the programmable circuits 118–121 is generated, one of the address decoded signals BLK0–BLK3 changes to the high level (see the portion (c) of FIG. 5). Thus, one of the transistor switches within the programmable circuits 118–121 is made conductive according to the states of the highest bit and the second highest bit of the generated address signal, so that one of the programmable circuits 118–121 is operatively connected to the precharge node PR. At the same time, half members of the transistors 111–116 are made conductive by high-level members of the address signal remaining bits A0–An-2 and XA0–XAn-2 and at least one of these conductive transistors is connected to an unblown member of the fuses within the programmable circuit operatively connected to the precharge node PR. Thus, the precharge node PR is discharged via the unblown fuse, and the signal at the precharge node PR changes to the low level state as shown by the solid line in the portion (d) of FIG. 5.

When address signals corresponding to addresses programmed in the other programmable circuit 119–121 are generated, the signal at the precharge node PR similarly continues to be in the high level state as shown by the broken line in the portion (d) of FIG. 5.

In the case where an address signal corresponding to one of the addresses programmed in the programmable circuit 118-121 is generated, the signal at the precharge node PR continues to be in the high level state so that the redundancy circuit activating signal SPE also continues to be in the high level state as shown by the broken line in the portion (e) of FIG. 5. Then, as shown in the portion (f) of FIG. 5, the clock signal CLK changes to the high level, and thus the redundancy circuit drive signal SPARE also changes to the high level as shown by the broken line in the portion (g) of FIG. 5. The high-level redundancy circuit drive signal SPARE enables access to a redundant (spare) memory cell in place of the defective memory cell. During this period, the ordinary circuit drive signal NORMAL remains at the low level as shown by the broken line in the portion (h) of FIG. 5. The low-level ordinary drive signal NORMAL inhibits access to the defective ordinary memory cell.

In the case where an address signal unrelated to any of the addresses programmed in the programmable circuits 118-121 is generated, the signal at the precharge node PR changes to the low level as shown by the solid line in portion (d) of FIG. 5 so that the redundancy circuit activating signal SPE also changes to the low level as shown by the solid line in the portion (e) of FIG. 5. Then, as shown in the portion (f) of FIG. 5, the clock signal CLK changes to the high level. The redundancy circuit drive signal SPARE continues to be in the low level state as shown by the solid line in the portion (g) of FIG. 5 independent of the change of the clock signal CLK to the high level. The low-level redundancy circuit drive signal SPARE inhibits access to a redundant (spare) memory cell. During this period, the ordinary circuit drive signal NORMAL changes to the high level as shown by the solid line in the portion (h) of FIG. 5. The high-level ordinary drive signal NORMAL enables access to an ordinary memory cell which is designated by the generated address signal.

The semiconductor integrated circuit of FIGS. 3 and 4 has the following advantages over the prior art semiconductor integrated circuit of FIG. 1. During access to a good ordinary memory cell, only the signal precharge node PR is charged and discharged, and only one of the programmable circuits 118-121 is operatively connected to the precharge node PR. Thus, the wasteful consumption of electric power can be smaller than that in the prior art semiconductor integrated circuit of FIG. 1. Since a generated address signal is fed to the single array of the transistors 111-116 and the single array of the AND gates 100-103, the address signal can be exposed to a smaller load than that in the prior art semiconductor integrated circuit of FIG. 1. The smaller load on the address signal is advantageous in the attainment of high-speed access to memory cells. Since the number of the fuses in each of the programmable circuits 118-121 is smaller than that in the prior art semiconductor integrated circuit of FIG. 1, the sum of the areas occupied by the fuses is smaller than that in the prior art semiconductor integrated circuit of FIG. 1.

DESCRIPTION OF THE SECOND PREFERRED EMBODIMENT

Figure 6:
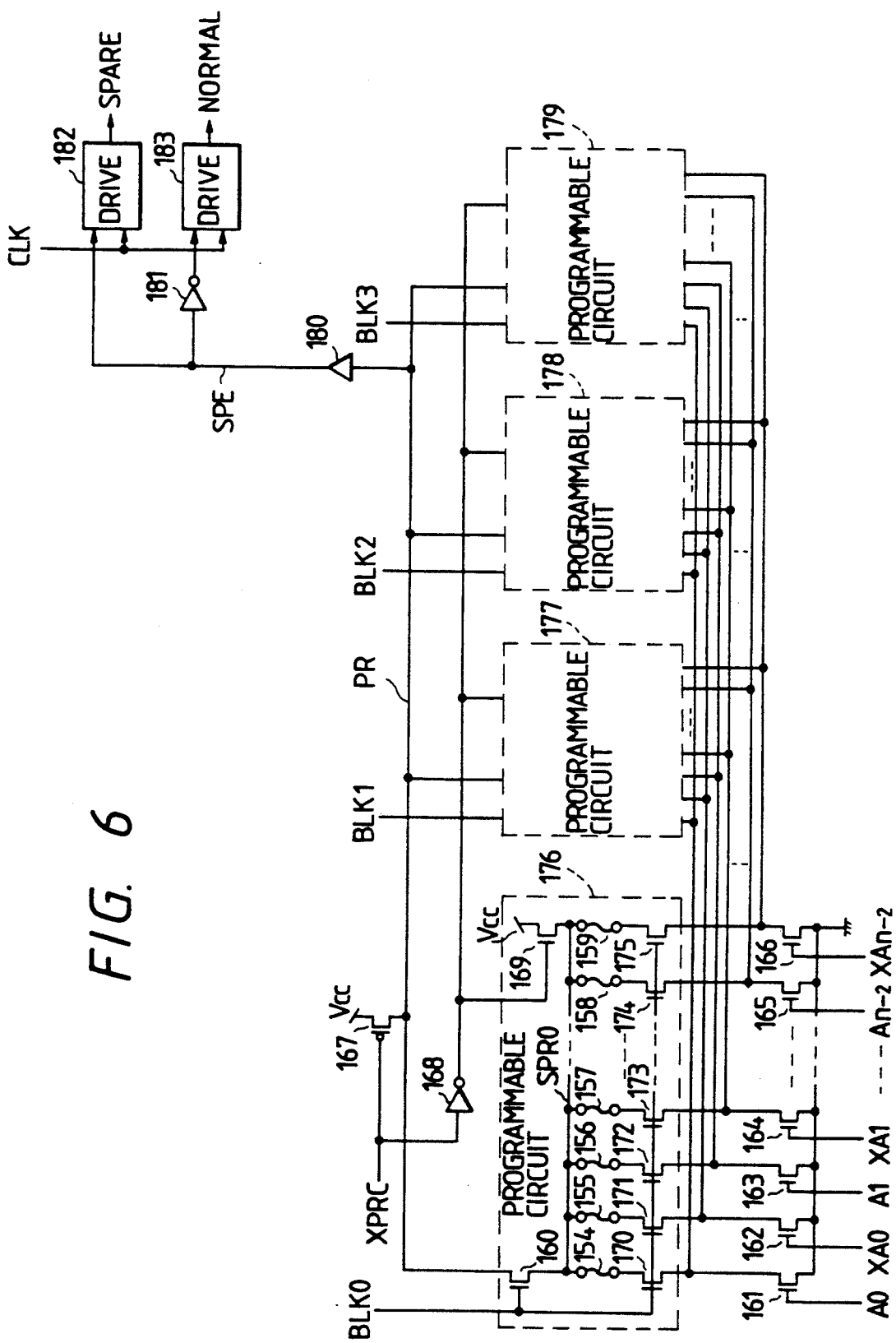
FIG. 6 is a diagram of a semiconductor integrated circuit according to a second embodiment of this invention.

FIG. 6 shows a semiconductor integrated circuit of a second embodiment of this invention in which a first address signal having bits A0, A1, ..., An is designed used for access to memory cells (not shown). A second address signal has bits XA0, XA1, ..., XAn which are logically complementary with the bits A0, A1, ..., An of the first address signal respectively.

Fuses 154-159 in a linear array are physically blown or unblown by a laser light beam when a redundancy circuit is required to be used. First ends of the fuses 154-159 are connected in common to a sub precharge node SPR0. Second ends of the fuses 154-159 are connected to the drains of n-channel transistors 170-175 respectively. An n-channel transistor 160 has a gate subjected to a 1-bit address decoded signal BLK0. The source of the transistor 160 is connected to a main precharge node PR. The drain of the transistor 160 is connected to the sub precharge node SPR0. The gates of the transistors 170-175 are subjected in common to the address decoded signal BLK0. The source of the transistors 170-175 are connected to the drains of n-channel transistors 161-166 respectively. The gates of the transistors 161-166 are subjected to the bits A0, XA0, A1, XA1, ..., An-2, XAn-2 of the address signals respectively. The sources of the transistors 161-166 are grounded, being subjected to a power supply ground potential.

A p-channel transistor 167 has a gate subjected to a precharge control signal XPRC. The source of the transistor 167 is subjected to a positive power supply voltage Vcc. The drain of the transistor 167 is connected to the main precharge node PR.

An inverter 168 inverts the precharge control signal XPRC, outputting the invention of the precharge control signal XPRC. An n-channel transistor 169 has a gate connected to the output terminal of the inverter 168. The gate of the transistor 169 is subjected to the inversion of the precharge control signal XPRC. The source of the transistor 169 is subjected to the positive power supply voltage Vcc. The drain of the transistor 169 is connected to the sub precharge node SPR0.

A programmable circuit 176 serves to program an address of a defective memory cell. The programmable circuit 176 includes the fuses 154-159, the transistor 160, the transistor 169, and the transistors 170-175. The programmable circuit 176 receives the address decoded signal BLK0, the inversion of the precharge control signal XPRC, and the signals at the drains of the transistors 161-166, and outputs a signal to the main precharge node PR.

Programmable circuits 177-179 are similar in structure to the programmable circuit 176. Transistors in the programmable circuit 177-179 which correspond to the transistors 160 and 170-175 in the programmable circuit 176 are subjected to 1-bit address decoded signals BLK1-BLK3 respectively. Transistors in the programmable circuits 177-179 which correspond to the transistor 169 in the programmable circuit 176 are subjected to the output signal of the inverter 168, that is, the inversion of the precharge control signal XPRC. Each of the programmable circuit 177-179 is connected to the main precharge node PR and the drains of the transistors 161-166 similarly to the connection of the programmable circuit 176 thereto. Each of the programmable circuits 177-179 receives the address decoded signal BLK1, BLK2, or BLK3, the inversion of the precharge control signal XPRC, and the signals at the drains of the transistors 161-166, and outputs a signal to the main precharge node PR.

An address decode (not shown) similar to the address decoder of FIG. 4 generates the address decoded signals BLK0-BLK3 in response to the highest bit An and the second highest bit An-1 of the first address signal, and the highest bit XAn and the second highest bit XAn-1 of the second address signal.

The signal at the main precharge node PR is transmitted through a buffer 180, and forms a redundancy circuit activating signal SPE. An inverter 181 receives the redundancy circuit activating signal SPE, and outputs the inversion of the redundancy circuit activating signal SPE. A driver 182 receives the redundancy circuit activating signal SPE and a clock signal CLK, and outputs a redundancy circuit drive signal SPARE. A driver 183 receives the inversion of the redundancy circuit activating signal SPE and the clock signal CLK, and outputs an ordinary circuit drive signal NORMAL.

Only one of the address decoded signals BLK0-BLK3 is in the high level state in response to the highest bit An and the second highest bit An-1 of the first address signal, and the highest bit XAn and the second highest bit XAn-1 of the second address signal. The transistor 160 within the programmable circuit 176 and the corresponding transistors within the programmable circuits 177-179 serve as switches for selectively connecting and disconnecting the sub precharge node SPR0 and the corresponding sub precharge nodes within the programmable circuits 176-179 to and from the main precharge node Pr in response to the address decoded signals BLK0-BLK3. Since only one of the address decoded signals BLK0-BLK3 is in the high level state, only one of the switches is closed so that only one of the sub precharge nodes within the programmable circuits 176-179 is operatively connected to the main precharge node PR. At the same time, the array of the transistor 170-175 within the programmable circuit 176 and the corresponding arrays of the transistors within the programmable circuits 177-179 serve as switches for selectively connecting and disconnecting the array of the fuses 154-159 and the corresponding arrays of the fuses within the programmable circuits 176-179 to and from the array of the transistors 161-166 in response to the address decoded signals BLK0-BLK3. Since only one of the address decoded signals BLK0-BLK3 is in the high level state, only one of the switches is closed so that only one of the fuse arrays within the programmable circuits 176-179 is operatively connected to the array of the transistors 161-166. In this way, one of the programmable circuits 176-179 is selected in response to the highest bit An and the second highest bit An-1 of the first address signal, and the highest bit XAn and the second highest bit XAn-1 of the second address signal. In other words, one of the programmable circuits 176-179 is selected in accordance with the highest and second highest bits of an address signal, and the four programmable circuits 176-179 correspond to the four different states of these two bits respectively.

During an address programming process, the highest and second highest bits of the address of a defective memory cell are examined, and one of the programmable circuits 176-179 which corresponds to the states of the highest and second highest bits of the address is decided as an object into which the address will be programmed.

It is now assumed that a defective ordinary memory cell is detected during the check of a semiconductor memory which is performed after the fabrication of the semiconductor memory. The highest and second highest bits of the address of the defective memory cell are examined, and one of the programmable circuits 176-179 which corresponds to the states of the highest and second highest bits of the address is elected. Half members of the fuses in the elected programmable circuit which correspond to the remaining bits of the address of the defective memory cell are physically blown before the shipment of the semiconductor memory. The blown fuses enable the redundancy circuit, allowing the selection of a redundant (spare) memory cell in place of the defective memory cell.

In the case where the states of the highest and second highest bits of an address of the defective memory cell correspond to the programmable circuit 176 and where the lowest bit of the address of the defective memory cell is "0" and the redundancy circuit is required to be used, the fuse 154 is unblown but the fuse 155 is blown by a laser light beam in view of the following fact. When an address signal corresponding to the defective memory cell is generated, the address signal bit A0 is in a low level state but the address signal bit XA0 is in a high level state so that the transistor 161 becomes non-conductive but the transistor 162 becomes conductive. In the case where the states of the highest and second highest bits of an address of the defective memory cell correspond to the programmable circuit 176 and where the lowest bit of an address corresponding to the defective memory cell is "1" and the redundancy circuit is required to be used, the fuse 155 is unblown but the fuse 154 is blown by the laser light beam in view of the following fact. When an address signal corresponding to the defective memory cell is generated, the address signal bit A0 is in the high level state but the address signal bit XA0 is in the low level state so that the transistor 161 becomes conductive but the transistor 162 becomes non-conductive. Similarly, the other fuses 156-159 are blown and unblown in accordance with the states of the remaining bits except the highest and second highest bits of the address of the defective memory cell. Specifically, the fuses 156-159 are separated into pairs corresponding to the remaining bits except the highest and second highest bits of the address of the defective memory cell respectively, and one of the fuses in each pair is blown according to the state of the related bit of the address of the defective memory cell. In this way, the third highest bit to the lowest bits of the address of the defective memory cell are programmed in the programmable circuit 176. Similarly, addresses of other defective memory cells can be programmed in the other programmable circuits 176-179. In the semiconductor integrated circuit of FIG. 6, since there are the four programmable circuits 176-179, four defective memory cells can be replaced by redundant (spare) memory cells.

The operation of the semiconductor integrated circuit of FIG. 6 will be explained hereinafter. As shown in the portions (a) and (d) of FIG. 7, during a first period for which the precharge control signal XPRC remains at a low level, the transistor 167 is made conductive so that the main precharge node PR is charged and then the signal at the main precharge node PR remains at a high level. At the same time, the transistor 169 within the programmable circuit 176 and the corresponding transistors within the other programmable circuits 177-179 are made conductive by the inversion of the precharge control signal XPRC which is outputted from the inverter 168, so that the sub precharge node SPR0 within the programmable circuit 176 and the corresponding sub precharge nodes within the other programmable circuits 177–179 are charged and then the signals at the sub precharge nodes remain at the high level as shown in the portion (e) of FIG. 7. Thereafter, the precharge control signal XPRC changes to a high level. As shown in the portions (a) and (b) of FIG. 7, after the change of the precharge control signal XPRC to the high level, the address signal bits AO-An and XAO-XAn are each settled in a high level state or a low state. Thus, as shown in the portion (c) of FIG. 7, one of the address decoded signals BLKO-BLK3 changes to a high level but the others continue to be in the low level states. The change of one of the address decoded signals BLKO-BLK3 to the high level makes conductive the related transistors (the transistors 160 and 170–175 in the case of the programmable circuit 176) within corresponding one of the programmable circuits 176–179.

Figure 7:
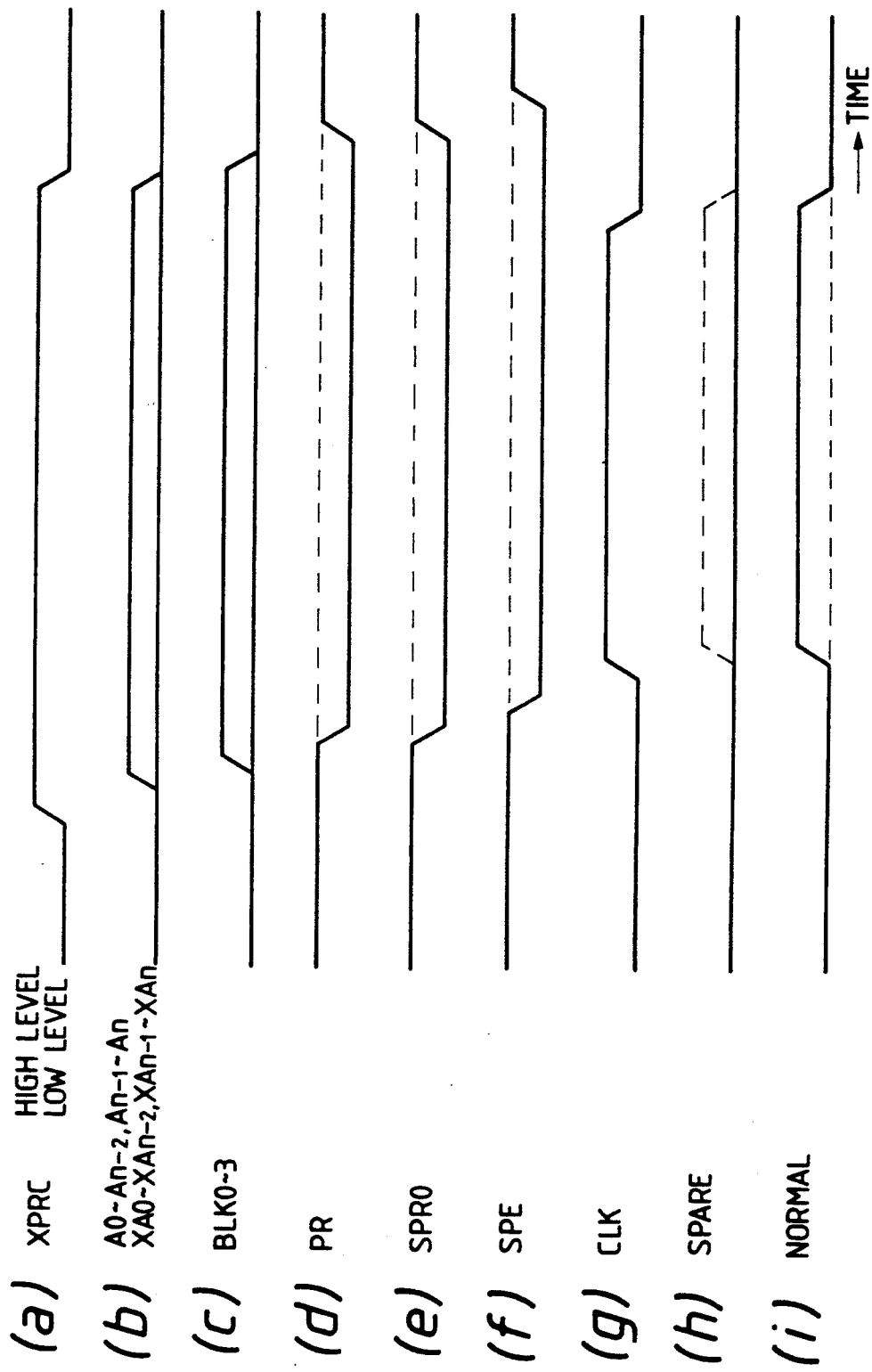
FIGS. 7(a)–(i) are a time domain diagram showing the waveforms of various signals in the semiconductor integrated circuit of FIG. 6.

For example, when an address signal corresponding to an address programmed in the programmable circuit 176 is generated, the address decoded signal BLKO changes to the high level but the other address decoded signals BLK1-BLK3 remains at the low level (see the portion (c) of FIG. 7). Thus, the transistor switch 160 within the programmable circuit 176 is made conductive but the corresponding transistor switches within the other programmable circuits 177–179 remain non-conductive according to the states of the highest bit and the second highest bit of the generated address signal, so that only the programmable circuit 176 is selected and operatively connected to the main precharge node PR. In addition, the transistor switches 170–175 within the programmable circuit 176 are made conductive but the corresponding transistor switches within the other programmable circuits 177–179 remain non-conductive according to the states of the highest bit and the second highest bit of the generated address signal, so that only the programmable circuit 176 is selected and operatively connected to the array of the transistors 161–166. At the same time, half members of the transistors 161–166 are made conductively by high-level members of the address signal remaining bits AO-An-2 and XAO-XAn-2 and all of these conductive transistors are connected to previously-blown members of the fuses 154–159 respectively. Thus, as shown by the broken line in the portion (d) of FIG. 7, the signal at the main precharge node PR continues to be in the high level state. In addition, as shown by the broken line in the portion (e) of FIG. 7, the signal at the sub precharge node SPRO continues to be also in the high level state.

The change of the transistor 160 to the conductive state in response to the "low"-to-"high" change of the address decoded signal BLKO enables charges to move between the main precharge node PR and the sub precharge node SPRO. Since the sub precharge node SPRO is previously charged as mentioned above, the escape of charges from the main precharge node PR into the sub precharge node SPRO is effectively blocked so that the change of the transistor 160 to the conductive state will not cause an unwanted drop in the voltage of the signal at the main precharge node PR.

When an address signal unrelated to any of addresses programmed in the programmable circuits 176–179 is generated, one of the address decoded signals BLKO-BLK3 changes to the high level (see the portion (c) of FIG. 5). Thus, one of the set of the transistor switches 160 and 170–175 within the programmable circuit 176 and the sets of the corresponding transistor switches within the other programmable circuits 177–179 are made conductive according to the states of the highest bit and the second highest bit of the generated address signal, so that one of the programmable circuits 118–121 is operatively connected to the main precharge node PR and the array of the transistors 161–166. At the same time, half members of the transistors 161–166 are made conductive by high-level members of the address signal remaining bits AO–An-2 and XAO–XAn-2 and at least one of these conductive transistors is connected to an unblown member of the fuses within the programmable circuit operatively connected to the main precharge node PR and the array of the transistors 161–166. Thus, the main precharge node PR and the sub precharge node within the selected programmable circuit are discharged via the unblown fuse, and the signal at the main precharge node PR and the signal at the sub precharge node within the selected programmable circuit change to the low level states as shown by the solid lines in the portions (d) and (e) of FIG. 7.

When address signals corresponding to addresses programmed in the other programmable circuits 177–179 are generated, the signal at the main precharge node PR similarly continues to be in the high level state as shown by the broken line in the portion (d) of FIG. 7. In addition, the signal at the sub precharge node within the selected programmable circuit continues to be in the high level state as shown by the broken line in the portion (e) of FIG. 7.

In the case where an address signal corresponding to one of the addresses programmed in the programmable circuits 176–179 is generated, the signal at the main precharge node PR continues to be in the high level state so that the redundancy circuit activating signal SPE also continues to be in the high level state as shown by the broken line in the portion (f) of FIG. 7. Then, as shown in the portion (g) of FIG. 7, the clock signal CLK changes to the high level, and thus the redundancy circuit drive signal SPARE also changes to the high level as shown by the broken line in the portion (h) of FIG. 7. The high-level redundancy circuit drive signal SPARE enables access to a redundant (spare) memory cell in place of the defective memory cell. During this period, the ordinary circuit drive signal NORMAL remains at the low level as shown by the broken line in the portion (i) of FIG. 7. The low-level ordinary drive signal NORMAL inhibits access to the defective ordinary memory cell.

In the case where an address signal unrelated to any of the addresses programmed in the programmable circuits 176–179 is generated, the signal at the main precharge node PR changes to the low level as shown by the solid line in the portion (d) of FIG. 7 so that the redundancy circuit activating signal SPE also changes to the low level as shown by the solid line in the portion (f) of FIG. 7. Then, as shown in the portion (g) of FIG. 7, the clock signal CLK changes to the high level. The redundancy circuit drive signal SPARE continues to be in the low level state as shown by the solid line in the portion (h) of FIG. 7 independent of the change of the clock signal CLK to the high level. The low-level redundancy circuit drive signal SPARE inhibits access to a redundant (spare) memory cell. During this period, the ordinary circuit drive signal NORMAL changes to the high level as shown by the solid line in the portion (i) of FIG. 7. The high-level ordinary drive signal NORMAL enables access to an ordinary memory cell which is designated by the generated address signal.

The semiconductor integrated circuit of FIG. 6 has the following advantages over the prior art semiconductor integrated circuit of FIG. 1. During access to a good ordinary memory cell, only the single main precharge node is charged and discharged, and only one of the programmable circuits 176–179 is operatively connected to the main precharge node PR and the array of the transistors 161–166. Thus, the wasteful consumption of electric power can be smaller than that in the prior art semiconductor integrated circuit of FIG. 1. Since a generated address signal is fed to the single array of the transistors 161–166 and the single array of AND gates within the address decoder, the address signal can be exposed to a smaller load than that in the prior art semiconductor integrated circuit of FIG. 1. The smaller load on the address signal is advantageous in the attainment of high-speed access to memory cells. Since the number of the fuses in each of the programmable circuits 176–179 is smaller than that in the prior art semiconductor integrated circuit of FIG. 1, the sum of the areas occupied by the fuses is smaller than that in the prior art semiconductor integrated circuit of FIG. 1.

What is claimed is:

1. A semiconductor integrated circuit comprising:
   a plurality of programmable circuits each including a plurality of fuses and a first transistor which has a gate subjected to an address decoded signal, a drain connected to first ends of the fuses, and a source connected to a common precharge node, wherein the address decoded signal results from decoding a first portion of an address signal for access to memory cells, and wherein the sources of the first transistors in the respective programmable circuits are connected to the common precharge node;
   a plurality of second transistors having gates subjected to a second portion of the address signal, sources connected to a first power supply line, and drains coupled to second ends of the fuses in each of the programmable circuits respectively, wherein the second portion of the address signal differs from the first portion of the address signal; and
   a third transistor having a gate subjected to a precharge control signal, a source connected to a second power supply line, and a drain connected to the common precharge node.

2. The semiconductor integrated circuit of claim 1, wherein each of the programmable circuits further includes a fourth transistor having a gate subjected to an inversion of the precharge control signal, a source connected to the second power supply line, and a drain connected to the first ends of the fuses, and a plurality of fifth transistors having gates subjected to the address decoded signal, sources connected to the drains of the second transistors respectively, and drains connected to the second ends of the fuses respectively.

3. A semiconductor integrated circuit comprising:
   first means for storing a state of a first bit of an address of a first defective memory cell;
   second means for storing a state of a first bit of an address of a second defective memory cell;
   third means for selecting one of the first means and the second means in response to a state of a second bit of an input address signal;
   fourth means for detecting whether or not a state of a first bit of the input address signal is equal to the state stored by the first means, and for detecting whether or not the state of the first bit of the input address signal is equal to the state stored by the second means;
   a common node;
   fifth means for outputting a spare memory cell selecting signal to the common node when the first means is selected by the third means and the fourth means detects that the state of the first bit of the input address signal is equal to the state stored by the first means, and for outputting the spare memory cell selecting signal when the second means is selected by the third means and the fourth means detects that the state of the first bit of the input address signal is equal to the state stored by the second means.

4. A semiconductor integrated circuit comprising:
   a common precharge node;
   first means for precharging the common precharge node to a charged state;
   second means for storing a state of a first bit of an address of a first defective memory cell;
   third means for storing a state of a first bit of an address of a second defective memory cell;
   fourth means for selecting one of the second means and the third means in response to a state of a second bit of an input address signal;
   fifth means for detecting whether or not a state of a first bit of the input address signal is equal to the state stored by the second means, and for detecting whether or not the state of the first bit of the input address signal is equal to the state stored by the third means;
   sixth means for holding common precharge node in the charged state when the second means is selected by the fourth means and the fifth means detects that the state of the first bit of the input address signal is equal to the state stored by the second means, and for holding the common precharge node in the charged state when the third means is selected by the fourth means and the fifth means detects that the state of the first bit of the input address signal is equal to the state stored by the third means; and
   seventh means for discharging the common precharge node from the charged state when the fifth means detects that the state of the first bit of the input address signal is not equal to any of the states stored by the second and third means.

* * * * *